United States Patent
Cheng et al.

(10) Patent No.: US 10,008,500 B2
(45) Date of Patent: Jun. 26, 2018

(54) SEMICONDUCTOR DEVICES

(71) Applicant: GLOBALFOUNDRIES INC., Grand Cayman (KY)

(72) Inventors: Kangguo Cheng, Schenectady, NY (US); Carl J. Radens, LaGrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/174,273

(22) Filed: Jun. 6, 2016

(65) Prior Publication Data
US 2017/0352661 A1    Dec. 7, 2017

(51) Int. Cl.
| H01L 27/11 | (2006.01) |
| H01L 27/092 | (2006.01) |
| H01L 21/8238 | (2006.01) |
| H01L 29/78 | (2006.01) |

(52) U.S. Cl.
CPC .. *H01L 27/0922* (2013.01); *H01L 21/823821* (2013.01); *H01L 21/823871* (2013.01); *H01L 27/1104* (2013.01); *H01L 29/7848* (2013.01)

(58) Field of Classification Search
CPC ............. H01L 27/1116; H01L 27/0924; H01L 21/823821; H01L 21/823814; H01L 21/823878; H01L 29/0847; H01L 29/785; H01L 29/66795; H01L 27/0207; H01L 27/11; G11C 8/16

USPC ......... 257/213, 347; 438/197, 157; 365/154, 365/156

See application file for complete search history.

(56) References Cited

U.S. PATENT DOCUMENTS

| 6,867,460 | B1 |  | 3/2005 | Anderson et al. |
| 7,202,494 | B2 |  | 4/2007 | Blanchard et al. |
| 7,471,548 | B2 |  | 12/2008 | Baiocco et al. |
| 9,000,557 | B2 |  | 4/2015 | Or-Bach et al. |
| 9,153,647 | B1 | * | 10/2015 | Cheng ................... H01L 29/165 |
| 2009/0166757 | A1 | * | 7/2009 | Baiocco ........... G01R 31/31816 257/393 |
| 2011/0182098 | A1 | * | 7/2011 | Liaw ..................... G11C 11/412 365/51 |
| 2014/0061801 | A1 | * | 3/2014 | Doornbos ......... H01L 21/82380 257/351 |
| 2015/0243667 | A1 |  | 8/2015 | Liaw |

OTHER PUBLICATIONS

Examination Report for TW Application No. 105121722 dated Apr. 20, 2017, 13 pages.

* cited by examiner

*Primary Examiner* — Mouloucoulaye Inoussa
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to segmented or cut finFET structures and methods of manufacture. The structure includes at least one logic finFET device having a fin of a first length, and at least one memory finFET device having a fin of a second length. The second length is shorter than the first length.

20 Claims, 4 Drawing Sheets

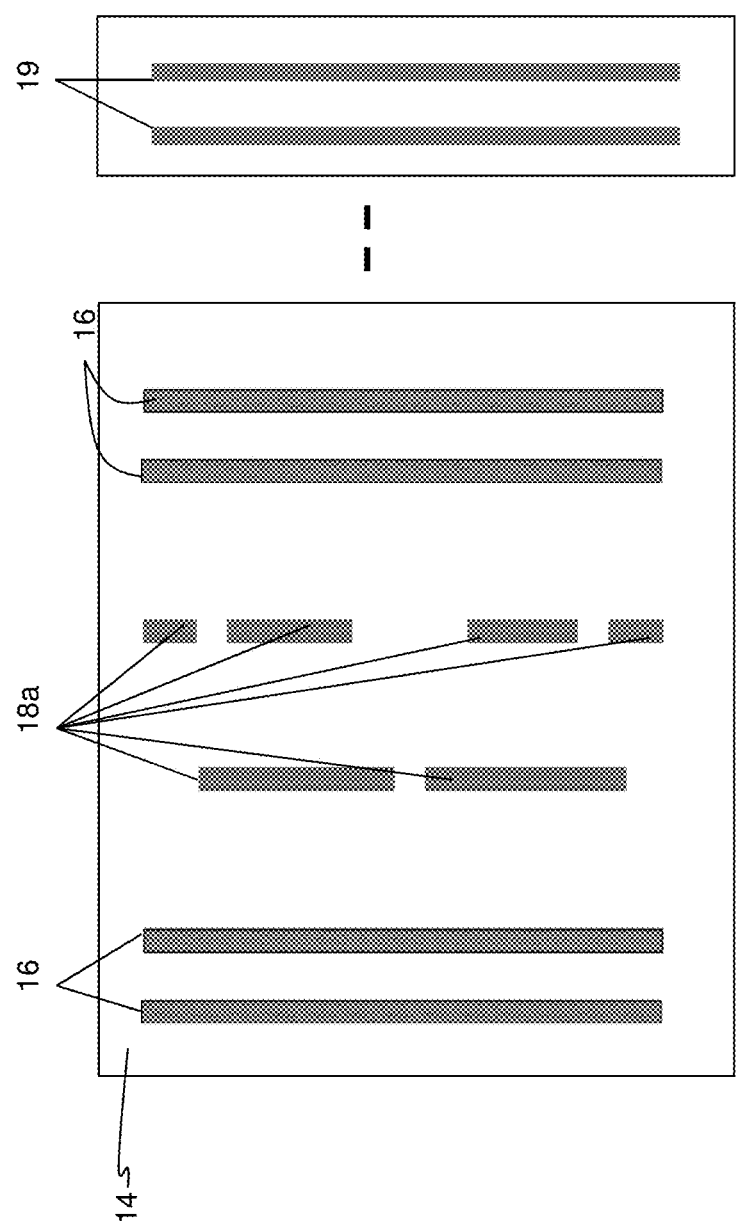

SEMICONDUCTOR DEVICES

FIELD OF THE INVENTION

The present disclosure relates to semiconductor structures and, more particularly, to segmented or cut finFET structures and methods of manufacture.

BACKGROUND

High Id is good for logic applications but not necessarily good for SRAM applications. For example, SRAM cell gamma ratio, which is the Id ratio between a pass-gate transistor (NFET) and a pull-up transistor (SiGe pFET), should be sufficiently large to prevent write failure, implying that the SiGe pFET should be weak for SRAM applications. Accordingly, the conflicting requirement of strong logic for a SiGe pFET and weak SiGe pFET poses a challenge in SiGe FinFET technology and design.

SUMMARY

In an aspect of the disclosure, a structure comprises: at least one logic finFET device having a fin of a first length; and at least one memory finFET device having a fin of a second length, shorter than the first length.

In an aspect of the disclosure, a structure comprises: at least one logic finFET device having a fin composed of SiGe material and being of a first length; and at least one pull-up finFET device having a segmented or cut fin composed of the SiGe material and having a second length shorter than the first length.

In an aspect of the disclosure, a method comprises: forming a plurality of fin structures composed of SiGe material; cutting selective ones of the plurality of fin structures into shorter fin structures; forming gate structures over the selective ones of the plurality of gate structures which are cut into shorter fin structures to form SRAM pull-up pFET devices with relaxed strain; and forming gate structures over the plurality of gate structures which have not been cut to form logic devices with higher strain than that of the SRAM pull-up pFET devices.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 2 shows segmented or cut fin structures and respective fabrication processes in accordance with aspects of the present disclosure.

DETAILED DESCRIPTION

The present disclosure relates to semiconductor structures and, more particularly, to segmented or cut finFET structures and methods of manufacture. More specifically, the present disclosure relates to finFET structures for increasing finFET SRAM pass-gate transistor and SiGe pull-up transistor gamma ratio and methods of manufacture. In embodiments, the finFET SRAM includes a comparatively short SiGe fin so it is relaxed and hence exhibits low Id; whereas, the logic, e.g., SiGe pull-up transistor, has a comparatively longer SiGe fin so it is strained and hence exhibits a high Id. Also a cross-couple design is used to electrically connect adjacent SRAM pFETs. Accordingly, the present structures described herein take advantage of strain relaxation to simultaneously form strong SiGe finFETs for logic and weak SiGe finFETs for SRAM.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
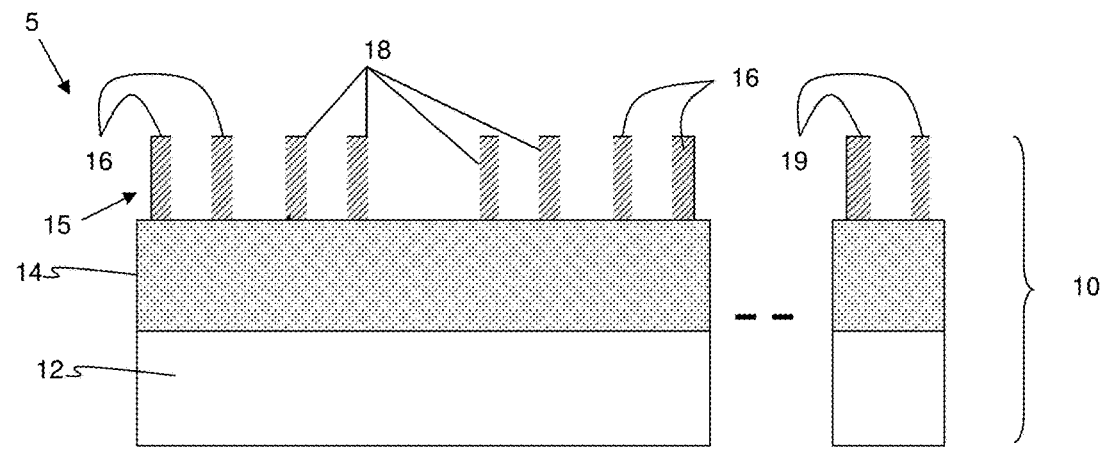
FIG. 1A shows a cross-sectional view of fin structures and respective fabrication processes in accordance with aspects of the present disclosure.
Figure 1B:
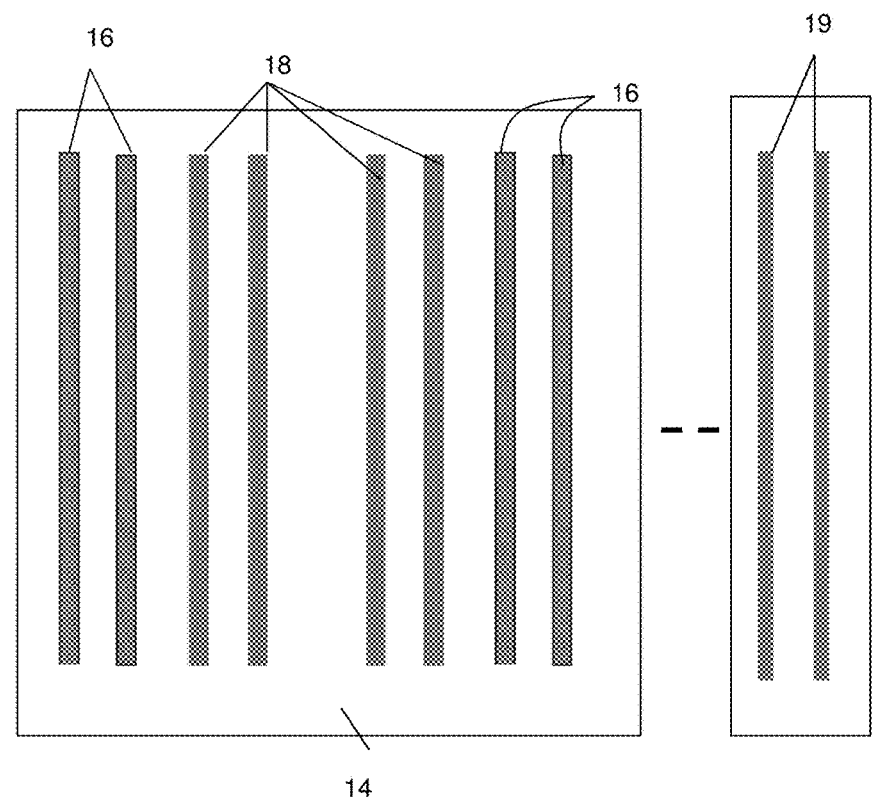
FIG. 1B shows a top view of the fin structures of FIG. 1A, in accordance with aspects of the present disclosure.

FIG. 1A shows a cross-sectional view of fin structures in accordance with aspects of the present disclosure. FIG. 1B shows a top view of the fin structures shown in FIG. 1A. More particularly, the structure 5 shown in FIGS. 1A and 1B includes a silicon on insulator (SOI) substrate 10. In embodiments, the SOI substrate 10 includes an insulator material 14 formed on a substrate 12. The insulator material 14 can be, for example, an oxide material (buried oxide or BOX). A semiconductor material, generally represented at reference numeral 15, is formed on the insulator material 14. In embodiments, the SOI substrate 10 can be formed in any conventional technique such as by conventional bonding techniques or SiMOX, to name a few techniques.

In embodiments, the semiconductor material 15 can be composed of any semiconductor material. For example, in embodiments, the semiconductor material 15 can be composed of any suitable material including, but not limited to, Si, SiGe, SiGeC, SiC, GaAs, InAs, InP, and other III/V or II/VI compound semiconductors. In contemplated embodiments described herein, for example, nFET devices can be composed of Si and used as pull-down and pass gate devices; whereas, pFET devices can be composed of SiGe and used for pull-up devices. In more specific embodiments, the SiGe material can be used for both logic and SRAM devices, with strong (strain) SiGe finFETs for logic and weak (relaxed strain) SiGe finFETs for SRAM as described herein. In embodiments, both the logic and the SRAM devices can be pFET devices, as an example.

As further shown in FIGS. 1A and 1B, a plurality of fins 16, 18, 19 are formed from the semiconductor material 15. In particular, the fins 16 are composed of Si material; whereas, the fins 18 and 19 are composed of SiGe material. In embodiments, the fins 18 will be used to form pFET SRAM pull-up devices; whereas, the fins 19 can be used for logic pFET devices (strained devices with long fin structures).

In embodiments, the fins 16, 18, 19 are formed by conventional sidewall image transfer (SIT) techniques. In the SIT technique, for example, a mandrel material, e.g., SiO$_2$, is deposited on the semiconductor material 15 using conventional deposition processes, e.g., chemical vapor deposition (CVD). A resist is formed on the mandrel material and exposed to light to form a pattern (openings). A reactive ion etching (RIE) is performed through the openings to form the mandrels. In embodiments, the mandrels can have different widths and/or spacing depending on the desired dimensions between narrow fin structures and/or wide fin structures. Spacers are formed on the sidewalls of the mandrels which are composed of material that is different than the mandrels, and which can be formed using conventional deposition processes known to those of skill in the art. The spacers can have a width which matches the dimensions of the fin structures 16, 18, 19, for example. The mandrels are removed or stripped using a conventional etching process, selective to the mandrel material. An etching (RIE) is then performed within the spacing of the spacers to form the sub-lithographic features. The sidewall spacers can then be stripped.

Referring to FIG. 2, the fin structures 18 shown in FIG. 1 can be cut or segmented to form shortened fin structures 18a. That is, some of the SiGe fin structures can be cut into shorter SiGe fins 18a so that each SRAM pull-up pFET has an individual SiGe fin to relax the strain (to weaken the drive current of the SiGe pFET). In embodiments, the fin structures 19 can remain longer (e.g., original length) than the segmented or cut fin structures 18a in order to maintain the drive current for the logic devices. In embodiments, the fin structures 18a can be about one half the length of the fin structures 16 and 19; although other lengths are contemplated herein. In any design, though, the strain on the fins can be significantly relaxed by cutting the SiGe fin structures, e.g., resulting in fin structures 18a.

The fins structures 18a shown in FIG. 2 can be segmented or cut by conventional lithography and etching processes. For example, a resist is formed over the fins structures of FIG. 1A. The resist is then exposed to light (energy) to form openings which correspond to ends or terminals of the fin structures 18a. An etching process (RIE) is then performed through the openings to cut or segment the fin structures 18a. The resist is stripped by conventional stripping processes such as, for example, oxygen ashing processes. In this way, the fin structures 18a can be formed, while maintaining the longer lengths of the fin structures 16, 19. In embodiments, the lengths of the fin structures 16 and 19 can also be adjusted during this same masking process, depending on the desired design criteria.

Figure 3:
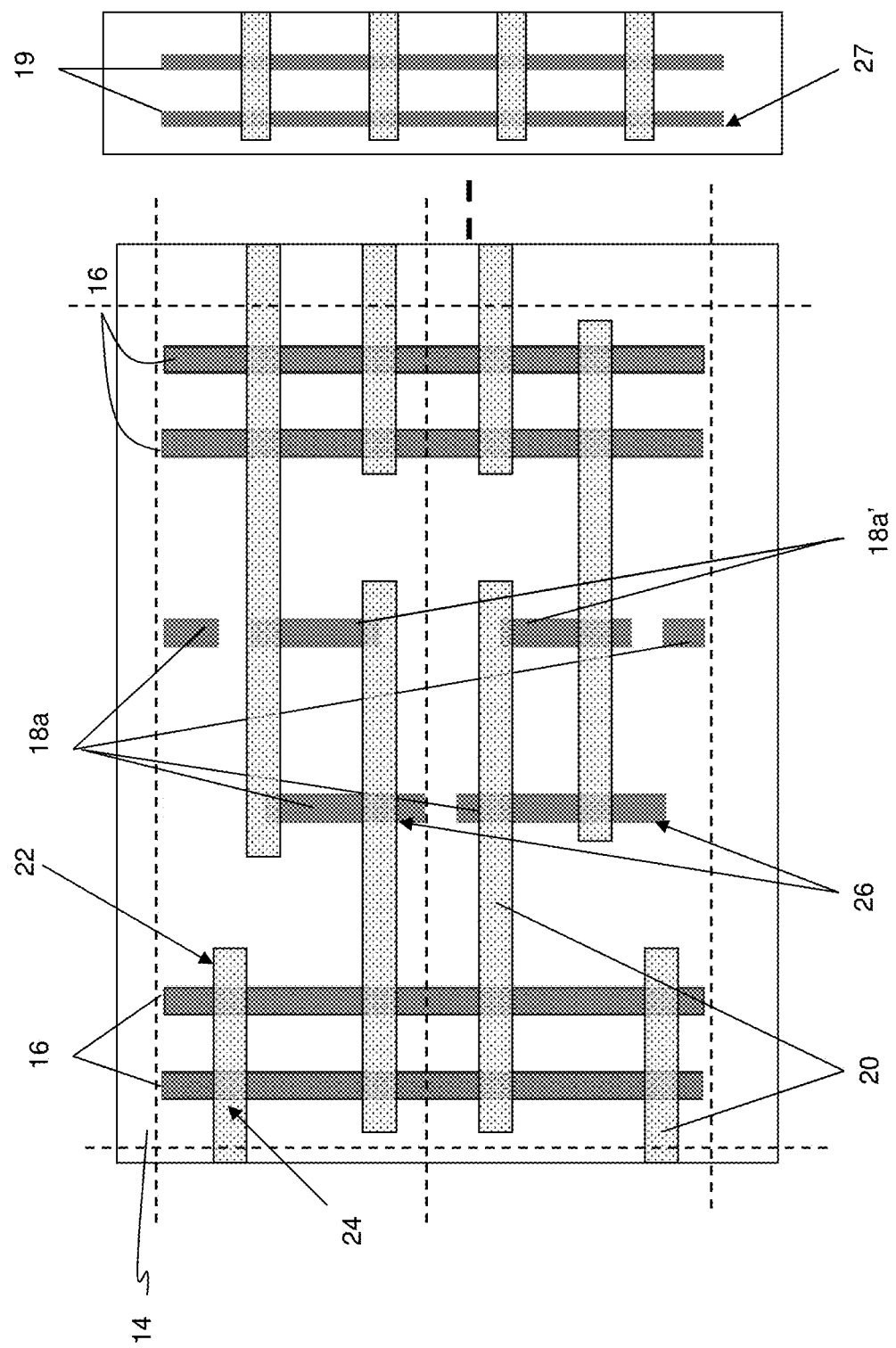
FIG. 3 shows gate structures formed over the fin structures of FIG. 2, and respective fabrication processes in accordance with aspects of the present disclosure.

As shown and described further herein, the fin structures 18a can extend past gate electrodes of the printed circuit. For example, FIG. 3 shows the formation of gate structures 22. In embodiments, the gate structures 22 can be formed by conventional deposition, lithography and etching processes. For example, the gate structures 22 can be composed of a gate dielectric material (e.g., either high-k or low-k dielectric materials) and metal or metal alloys of certain workfunction deposited over the fins structures 16, 18a and 19. In embodiments, the deposition of the gate dielectric material and workfunction metals can be formed by conventional deposition processes, e.g., CVD processes, followed by conventional lithography and etching (RIE) processes to pattern the gate material. The formation of the gate structures 22 further includes formation of spacers (deposition of spacer material) and source/drain regions (using conventional ion implantation or doping processes) as should be understood by those of skill in the art. In embodiments, the gate structures 22 will span the Si and SiGe fin structures used for SiGe pull-up devices 26, Si pull-down devices 24 and SiGe logic devices 27, as examples. Also, in embodiments, certain shortened fin structures 18a' can be terminated with the gate structures 24.

Figure 4:
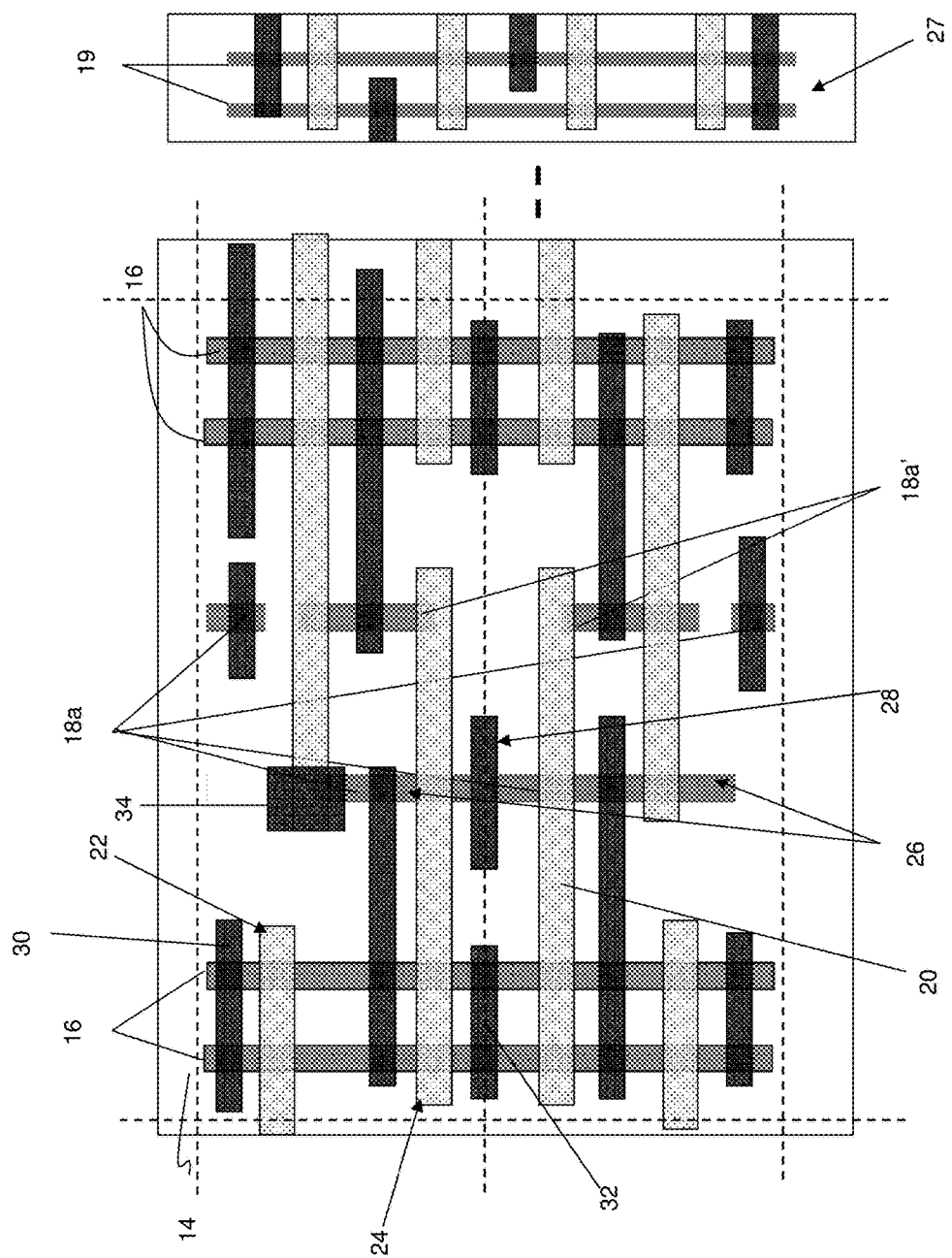
FIG. 4 shows trench silicide and local interconnect structures and respective fabrication processes in accordance with aspects of the present disclosure.

FIG. 4 shows trench silicide and local interconnect structures formed over the fin structures of FIG. 3, and respective fabrication processes in accordance with aspects of the present disclosure. In embodiments, the trench silicide can be formed using conventional silicide processes. For example, as should be understood by those of skill in the art, the silicide process can begin with trench formation followed by deposition of a thin transition metal layer, e.g., nickel, cobalt or titanium, over fully formed and patterned semiconductor devices (e.g., doped or ion implanted source and drain regions and respective devices 24, 26, 27, 28). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices when a gate structure is composed of a metal material.

The silicide process can be followed by contact formation. For example, the contacts can be formed in an inter-level dielectric material using conventional lithography, etching and deposition processes as already described herein. In embodiments, the deposition process comprises the deposition of a conductive material such as, for example, tungsten, aluminum, etc. As shown and described herein, terminals of adjacent SiGe pull-up devices 26 can be electrically connected together by a common contact 28, e.g., Vdd. Accordingly, in contact formation, a single contact, e.g., Vdd 28, can be used to stitch together adjacent pFET terminals of the segmented or shortened SiGe pull-up devices 26 to achieve electrical connection. FIG. 3 further shows the formation of bitlines 30 and ground contacts 32. Cross-coupled contacts 34 can also be formed to bridge between the SiGe pull-up devices 26 and adjacent printed circuits.

Accordingly, as should now be understood by those of skill in the art, logic SiGe pFETs and SRAM pull-up SiGe pFETs 26 can be formed on the same chip, with logic pFETs 27 having a relatively longer SiGe fin and the SRAM pFETs 26 having a relatively shorter SiGe fin. In this way, each SRAM pull-up pFET 26 has a separate SiGe fin (to relax strain), and can include a contact 28 to stitch adjacent pFET terminals together. It should further be understood that the fabrication processes and respective structures shown in FIGS. 1A-4 can be representative of a six transistor (6T) SRAM cell.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one logic finFET device having a fin of a first length; and
   at least one memory finFET device having a fin of a second length, shorter than the first length, and having a weaker drive current than the at least one logic finFET device and having the weaker drive current than a drive current of the at least one logic finFET device due to the at least one memory finFET device having the shorter fin length.

2. The structure of claim 1, wherein the at least one logic finFET device and the at least one memory finFET device are pFET devices.

3. The structure of claim 2, wherein the fins of the at least one logic finFET device and the at least one memory finFET device comprise SiGe material.

4. The structure of claim 3, wherein the at least one memory finFET device is a SiGe pull-up device.

5. The structure of claim 3, wherein the second length is about half of the first length.

6. The structure of claim 3, wherein the at least one memory finFET device has a relaxed strain compared to the at least one logic finFET device.

7. The structure of claim 3, wherein the at least one logic finFET device and the at least one memory finFET device are on a same chip.

8. The structure of claim 7, wherein the at least one memory finFET device are two memory finFET devices composed of a separated or cut fin structure composed of the SiGe material.

9. The structure of claim 8, wherein the at least one memory finFET device are two memory finFET devices with their adjacent terminals electrically connected together by a common contact.

10. The structure of claim 9, wherein the common contact is a common Vdd.

11. The structure of claim 9, wherein the at least one memory finFET device is separate SRAM pull-up pFET devices, each of which has a separate SiGe fin.

12. A structure, comprising:
    at least one logic finFET device with a first current drive and having a fin composed of SiGe material and being of a first length; and
    at least one pull-up finFET device with a second current drive and having a segmented or cut fin composed of the SiGe material and having a second length shorter than the first length, wherein the first current drive is greater than the second current drive and having the first current drive greater than the second current drive due to a longer fin length from the first length.

13. The structure of claim 12, wherein the at least one logic finFET device and the at least one pull-up finFET device are pFET devices formed on a same chip.

14. The structure of claim 13, wherein the second length is about half of the first length such that the fin of the second length has a more relaxed strain that the fin of the first length.

15. The structure of claim 13, wherein the at least one pull-up finFET device is two devices each composed of a single fin that is segmented or cut fin and whose terminals have a common electrical contact.

16. The structure of claim 15, wherein the common contact is a common Vdd.

17. The structure of claim 13, wherein the at least one pull-up finFET device are separate SRAM pull-up pFET devices, each of which has a separate SiGe fin.

18. The structure of claim 13, further comprising an nFET device formed on the same chip, comprising a fin composed of Si material.

19. The structure of claim 11, wherein the separate SiGe fins weaken a drive current of the separate SRAM pull-up pFET devices causing the at least one memory finFET device to have the weaker drive current than the at least one logic finFET device.

20. The structure of claim 19, wherein the weaker drive current increases a transistor gamma ratio.

* * * * *